US010317569B2

(12) United States Patent
Sun et al.

(10) Patent No.: US 10,317,569 B2
(45) Date of Patent: Jun. 11, 2019

(54) METHOD OF STRATIGRAPHIC MODELING OF FAULTS

(71) Applicant: Chevron U.S.A. Inc., San Ramon, CA (US)

(72) Inventors: Tao Sun, Sugar Land, TX (US); Martin Perlmutter, Houston, TX (US); Michael James Pyrcz, Houston, TX (US); Morgan Sullivan, Houston, TX (US); Ashley Harris, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 783 days.

(21) Appl. No.: 14/483,371

(22) Filed: Sep. 11, 2014

(65) Prior Publication Data
US 2016/0077237 A1    Mar. 17, 2016

(51) Int. Cl.
*G01V 99/00* (2009.01)
*G06F 17/50* (2006.01)

(52) U.S. Cl.
CPC ...... *G01V 99/005* (2013.01); *G01V 2210/642* (2013.01); *G06F 17/5009* (2013.01)

(58) Field of Classification Search
CPC .................. G01V 99/005; G01V 2210/642
See application file for complete search history.

(56) References Cited

U.S. PATENT DOCUMENTS

2006/0253759 A1* 11/2006 Wei .................. G01V 1/282
714/738
2009/0265152 A1* 10/2009 Cacas ................. G01V 99/00
703/6

(Continued)

FOREIGN PATENT DOCUMENTS

EP          2110686 A1    10/2009
WO    WO2006/113939 A1    10/2006

OTHER PUBLICATIONS

PCT International Preliminary Report on Patentability, PCT International Application No. PCT/US2015/022385 dated Mar. 23, 2017, pp. 1-7.

(Continued)

*Primary Examiner* — Alexander Satanovsky
*Assistant Examiner* — Brent A. Fairbanks
(74) *Attorney, Agent, or Firm* — Mary R. Bram; Melissa M. Hayworth; Marie L. Clapp (57) ABSTRACT

A new gridding method is disclosed for forward stratigraphic modeling that allows for syndepositional and/or postdepositional fault movement. The new gridding algorithm may represent both the lateral move of structure block, and provide efficiency that is comparable to the structured grid for forward stratigraphy model accessing previous deposited sediments stored in the grid. Embodiments of the disclosed methods allow for structural moves by performing a set of simple operations on the grid. The operations are generally simple, and do not change the overall topology of the grid. Therefore the operation can be easily repeated and the overall topological structure of the grid remains largely unchanged for simple access by the forward stratigraphic model. Further details and advantages of various embodiments of the method are described in more herein.

22 Claims, 12 Drawing Sheets

(56) References Cited

U.S. PATENT DOCUMENTS

| | | | | |
|---|---|---|---|---|
| 2013/0138412 A1* | 5/2013 | Shi | ......................... | G01V 1/302 |
| | | | | 703/2 |
| 2013/0218539 A1* | 8/2013 | Souche | ............... | G06F 17/5009 |
| | | | | 703/2 |
| 2013/0231903 A1* | 9/2013 | Li | ......................... | G01V 1/325 |
| | | | | 703/2 |
| 2013/0332125 A1* | 12/2013 | Suter | ..................... | G01V 99/00 |
| | | | | 703/6 |

OTHER PUBLICATIONS

PCT International Search Report and Written Opinion, International Application No. PCT/US2015/022385, dated Sep. 25, 2015.

* cited by examiner

METHOD OF STRATIGRAPHIC MODELING OF FAULTS

CROSS-REFERENCE TO RELATED APPLICATIONS

Not applicable.

STATEMENT REGARDING FEDERALLY SPONSORED RESEARCH OR DEVELOPMENT

Not applicable

BACKGROUND

Field of the Invention

This invention relates generally to the field of geological exploration for hydrocarbons. More specifically, the invention relates to a method of stratigraphic modeling of faults.

Background of the Invention

One of the significant technology hurdles in develop realistic forward stratigraphic models in the environment where there are syndepositional structure movement are the abilities for the model to represent the lateral move of the structure blocks. One typical example is the growth fault, where the previously deposited sediments above the fault (hanging wall) not only moves downwards, but also moves away along the fault from the source of the sediments. Not capturing these lateral displacement of deposits will likely result in unrealistic stacking patterns, erroneous rock property distributions and subsequently significant reduce the applicability of the stratigraphy models and their predictive capabilities.

The starting point for stratigraphic modeling is gridding. Gridding can be described as the process of decomposing a 3D geological volume into a plurality of smaller and simpler 3D volumes, which are typically referred to as cells, finite volumes, control volumes, or finite elements depending on the discretization and simulation techniques being utilized. Accordingly, stratigraphic gridding techniques break a continuous domain into discrete counterparts that can subsequently be used to construct a stratigraphic model by discretizing the equations describing fluid flow, geomechanics, or a combination thereof. In other words, a grid (structured or unstructured) is imposed upon an area of interest in a reservoir or earth model to define a plurality of cells (e.g., non-overlapping polyhedral cells), each having one or more unknown properties associated therewith, that approximate the shape and geometry of the reservoir. The unknown properties serve to characterize the reservoir and can include, but are not limited to, fluid properties such as pressure, temperature or water saturation, and rock properties such as rock lithology, permeability or porosity.

The primary challenge in representing lateral movement of structure blocks in a stratigraphic model is the need for current existing gridding algorithms that can efficiently performs two essential tasks simultaneously: (1) allow the forward stratigraphy model to access the previously deposited sediments in the computational grid efficiently at any location in the computational domain, and at any time during the simulation, for modeling sediment erosion and deposition processes; and (2) allow lateral and vertical movement of any part of the grid to realistically represent the structure move. While a 3D unstructured grid can be re-meshed to represent the structure move realistically, the algorithm is computational expensive and not efficient. More importantly, 3D fully unstructured mesh may not be optimal for forward stratigraphic model, as such a mesh generally needs a significant amount of computations for stratigraphic models to access the sedimentary information stored in the mesh. On the other hand, the structured grid is commonly used in forward stratigraphic model because it provides an efficient way for stratigraphic model to access the sedimentary information stored at any location from the surface. However, the grid does not offer any possibilities for perform lateral translations of any part of the grid without having to resort to a complete re-gridding, which will be computational prohibitive if the operation has to be performed frequently.

Consequently, there is a need for improved methods and systems to enable forward stratigraphic models with faulting.

BRIEF SUMMARY

A new gridding method is disclosed for forward stratigraphic modeling that allows for syndepositional and/or postdepositional faulting. Embodiments of the method may provide easy search and access to individual cells in the grid for stratigraphic modeling, and also may provide the abilities to segment and move the grid, including moving portions of the grid laterally relative to each other for fault modeling. The new gridding algorithm may represent both the lateral move of structure block, and provide efficiency that is comparable to the structured grid for forward stratigraphy model accessing previous deposited sediments stored in the grid. Embodiments of the disclosed methods allow for structural moves by performing a set of simple operations on the grid. The operations are generally simple, and may not change the overall topology of the grid. Therefore the operation can be easily repeated and the overall topological structure of the grid remains largely unchanged for simple access by the forward stratigraphic model.

In an embodiment, a computer-implemented method of stratigraphic modeling of faults comprises (a) generating a stratigraphic grid volume representing a plurality of subterranean layers, the stratigraphic grid volume comprising a fault. The method also comprises (b) dividing the stratigraphic grid volume into a plurality of grid sub-volumes, wherein each sub-volume is defined by a lower reference surface and an upper reference surface, wherein each grid sub-volume comprises a plurality of cells, wherein each cell is spatially defined relative only to the upper and the lower reference surfaces of the sub-volume. The method further comprises (c) separating each of the upper and lower reference surfaces of each grid sub-volume into a foot wall surface section surface and a hanging wall surface section surface. In addition, the method comprises (d) extending each reference surface from each grid sub-volume to follow the fault. The method additionally comprises (e) grouping the reference surfaces from the foot wall section together to form a foot wall surface set, and the references surfaces from the hanging wall section together to form a hanging wall surface set. Moreover, the method comprises (f) shifting the foot wall surface set and the hanging wall surface set along the fault to model movement along the fault, and wherein at least one of (a) through (f) is performed on a computer.

In another embodiment, a computer system comprises an interface for receiving one or more user inputs. The system also comprises a memory resource. The system further comprises input and output functions for presenting and receiving communication signals to and from a human user. In addition, the system comprises one or more central processing units for executing program instructions and program memory, coupled to the central processing unit, for storing a computer program including program instructions that, when executed by the one or more central processing units, cause the computer system to perform a plurality of operations for stratigraphic modeling of one or more faults, the plurality of operations comprising (a) generating a stratigraphic grid volume representing a plurality of subterranean layers, the stratigraphic grid volume comprising a fault. The operations also comprise (b) dividing the stratigraphic grid volume into a plurality of grid sub-volumes, wherein each sub-volume is defined by a lower reference surface and an upper reference surface, wherein each grid sub-volume comprises a plurality of cells, wherein each cell is spatially defined relative only to the upper and the lower reference surfaces of the sub-volume. The operations further comprise (c) separating each of the upper and lower reference surfaces of each grid sub-volume into a foot wall surface section surface and a hanging wall surface section surface. In addition, the operations comprise (d) extending each reference surface from each grid sub-volume to follow the fault. The operations additionally comprise (e) grouping the reference surfaces from the foot wall section together to form a foot wall surface set, and the references surfaces from the hanging wall section together to form a hanging wall surface set. Moreover, the operations comprise (f) shifting the foot wall surface set and the hanging wall surface set along the fault to model movement along the fault, and wherein at least one of (a) through (f) is performed on a computer.

In another embodiment, the method is stored on a non-transitory, electronic storage medium having stored processor readable instructions, wherein the instructions are configured to cause one or more processors to perform a method of stratigraphic modeling of faults, the method comprising (a) generating a stratigraphic grid volume representing a plurality of subterranean layers, the stratigraphic grid volume comprising a fault. The method also comprises (b) dividing the stratigraphic grid volume into a plurality of grid sub-volumes, wherein each sub-volume is defined by a lower reference surface and an upper reference surface, wherein each grid sub-volume comprises a plurality of cells, wherein each cell is spatially defined relative only to the upper and the lower reference surfaces of the sub-volume. The method further comprises (c) separating each of the upper and lower reference surfaces of each grid sub-volume into a foot wall surface section surface and a hanging wall surface section surface. In addition, the method comprises (d) extending each reference surface from each grid sub-volume to follow the fault. The method additionally comprises (e) grouping the reference surfaces from the foot wall section together to form a foot wall surface set, and the references surfaces from the hanging wall section together to form a hanging wall surface set. Moreover, the method comprises (f) shifting the foot wall surface set and the hanging wall surface set along the fault to model movement along the fault.

The foregoing has outlined rather broadly the features and technical advantages of the invention in order that the detailed description of the invention that follows may be better understood. Additional features and advantages of the invention will be described hereinafter that form the subject of the claims of the invention. It should be appreciated by those skilled in the art that the conception and the specific embodiments disclosed may be readily utilized as a basis for modifying or designing other structures for carrying out the same purposes of the invention. It should also be realized by those skilled in the art that such equivalent constructions do not depart from the spirit and scope of the invention as set forth in the appended claims.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following description and claims to refer to particular system components. This document does not intend to distinguish between components that differ in name but not function.

In the following discussion and in the claims, the terms "including" and "comprising" are used in an open-ended fashion, and thus should be interpreted to mean "including, but not limited to . . . ". Also, the term "couple" or "couples" is intended to mean either an indirect or direct connection. Thus, if a first device couples to a second device, that connection may be through a direct connection, or through an indirect connection via other devices and connections.

DETAILED DESCRIPTION OF THE PREFERRED EMBODIMENTS

Referring now to the Figures, embodiments of the disclosed methods will be described. As a threshold matter, embodiments of the methods may be implemented in numerous ways, as will be described in more detail below, including for example as a system (including a computer processing system), a method (including a computer implemented method), an apparatus, a computer readable medium, a computer program product, a graphical user interface, a web portal, or a data structure tangibly fixed in a computer readable memory. Several embodiments of the disclosed methods are discussed below. The appended drawings illustrate only typical embodiments of the disclosed methods and therefore are not to be considered limiting of its scope and breadth.

In an embodiment, the method involves, unlike a conventional grid where the absolute spatial position (x, y, z) of each cell is explicitly defined, the global structure of the grid may be represented using a parameterized scheme. Under this parameterized scheme, the spatial transformation of at least a portion of the grid volume can be achieved by changing a few parameters characterized by the grid volume 100. Since the numbers of the parameters that are needed to be changed may be multiple orders of magnitude less than the total number of the cells represented in the grid, subsequently the algorithm may be very efficient in representing the lateral and vertical movement of the different layers or structures.

Referring now to FIGS. 1A-1H and FIG. 2, in an embodiment, a computer depositional model generates a stratigraphic model grid volume 100 which may include one or more subsurface layers or structures which represent the modeled subsurface topography or physical features of a subterranean area of interest. Any computer depositional models or techniques used to generate such models which are known to those of skill in the art may be used. See e.g., Tetzlaff, D. M., and Harbaugh, J. W., Simulating Clastic Sedimentation, Van Nostrand Reinhold, New York, N.Y. 10003, page 137-153, (1989). The grid 100 may be composed of a set of grid sub-volumes 101A-101C. The grid sub-volumes 101a-101b may be arranged in a logically sequential manner. In other words, if the grid sub-volume 101a is above another grid sub-volume 101b, at a global location ($x_{g1}$, $y_{g1}$), the grid sub-volume 101a will also be above grid volume 101b at any other global location ($x_{g2}$, $y_{g2}$) within the domain of calculation. One example of a grid sub-volume is the volume 101a between surface 102 and surface 104 as shown in the FIG. 1A.

Surfaces 102, 104, and 106 shown in FIG. 1 may be defined as reference surfaces for purposes of illustration here. Grid sub-volume 101a, which is shown in extracted form in FIG. 1B, may be composed of a reference surface 104 at the bottom and reference surface 102 at the top, and an array 105 of cells 107. In one embodiment, the array of the cells may be arranged spatially on a grid defined locally to each of the grid volumes. In an embodiment, the grid may be a regular rectilinear grid. Other arrangements of the cells are also contemplated in other embodiments of the disclosed methods. On each of the reference surfaces, a local coordinate system may be defined. The global position ($x_g$, $y_g$) of the origin of the local coordinate system point (0,0) may be two of the parameters that are associated with each of the reference surfaces. Reference surfaces may also contain a global z value at the each point of local rectilinear grid, namely z(i, j), where i, j may be the index of the local regular grid associated with each grid volume. Each cell array 105 may be composed of any number of cells, stacked or arranged vertically. Each individual cell 107 in an array 105 may have different thickness. The number of cells may also vary in the different cell arrays 105. Furthermore, each cell may be of different geometries or polyhedral shapes such as without limitation, cuboidal, pyramidal, etc. In addition to all the sedimentary and depositional information, such as volume proportions of the sediments of different sizes, deposition time, and other non-grid related information, the thickness value may also be stored in each cell 107.

To access any sedimentary and other information stored in the cell, the global coordinate ($x_g$, $y_g$) is first mapped to the local coordinates (i, j) of the grid sub-volumes. That is, the individual cell 107 coordinates may be defined relative to the reference surfaces of grid sub-volumes (e.g. 101a, 101b). A local coordinate system may be defined on the upper reference surface (e.g. 102) with a vector R which defines the coordinate transformation from the local coordinate system to the model global coordinate system. A local 2D (in map view of the upper reference surface) grid may also be defined on the upper reference surface (e.g. 102). This 2D grid may be either structured, or unstructured. Between the two reference surfaces (e.g. 102 and 104), cells 107 are added to represent the sediments in the subterranean layer. Each cell 107 may have a shape of that of the 2D grid cell that was defined on the upper reference surface (e.g. 102).

Cells 107 may be accessed from the top of the cell stack until the right depth is reached. Since in forward stratigraphic modeling, the accesses of the cells may be sequential, namely the top cell may be first eroded before the information in bottom cell is needed, the algorithm is very efficient. Also, since the cells do not contain any global spatial information, only spatial information defined relative to the reference surfaces, the translation or movement of any particular cell may be accomplished merely by changing the value of ($x_g$, $y_g$) and the values of z(i, j) on the reference surfaces, without have to modify any of the spatial values that are stored in the cells.

Figure 3:
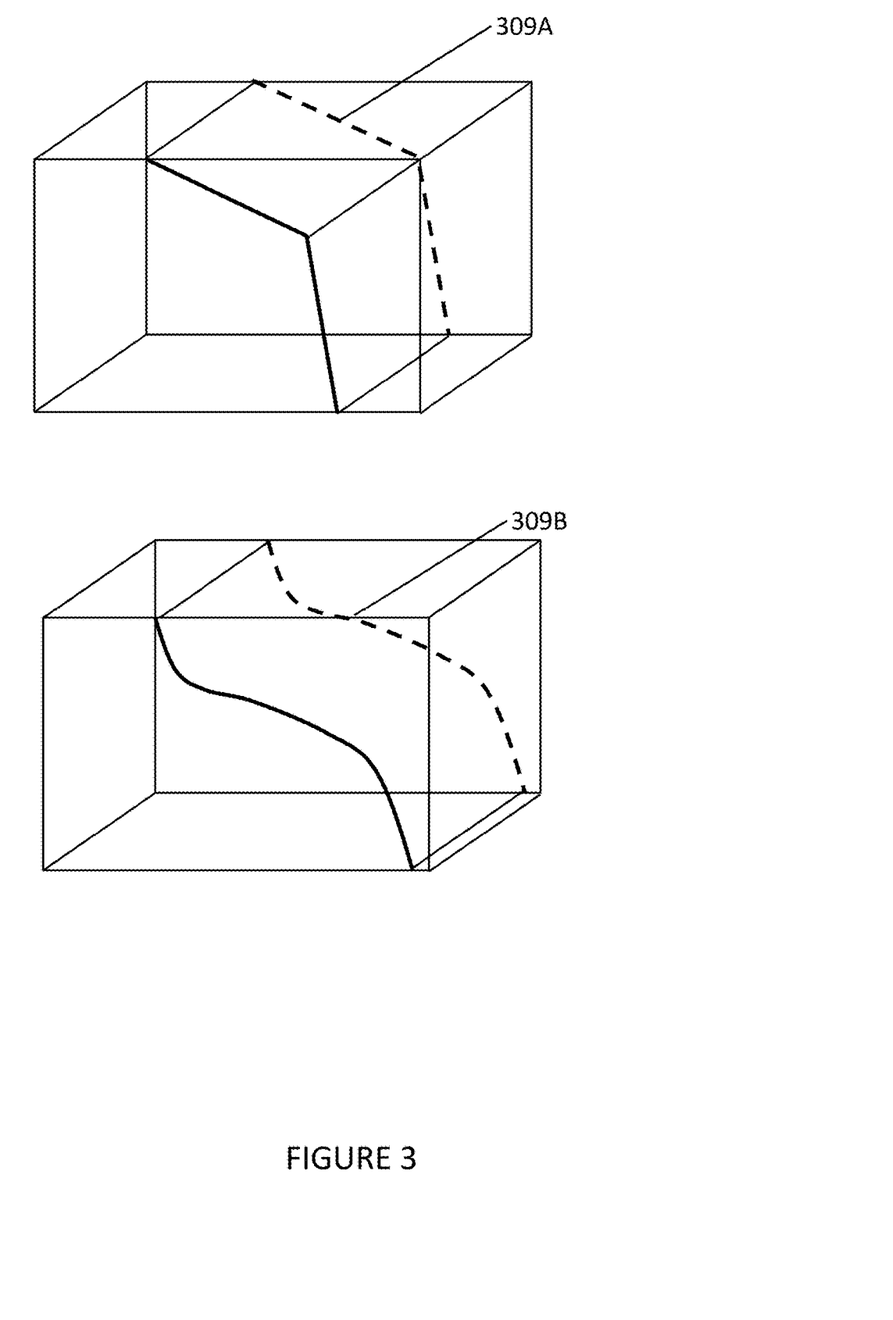
FIG. 3 illustrates different fault which may be modeled with embodiments of the disclosed methods.

In an embodiment, to model or simulate a fault or fault movement, a surface 102a-1 may be extended along the fault 109 and/or detachment plain to be used to partition the current grid into separate portions or parts. As shown in FIGS. 1A-1J, the fault 109 is depicted as a straight diagonal plane. However, any geometry of fault may be modeled. As shown in FIG. 3 for example, the fault may be curved 309B, angled in any direction, may have undulating surfaces, may have more than one segment 309A, etc. A user may input fault parameters such as fault geometry, number of surfaces, fault movement vectors, etc. In further embodiments, the fault 109 geometry may be modeled based on parameters, geological inputs or geological principles.

Figure 1A:
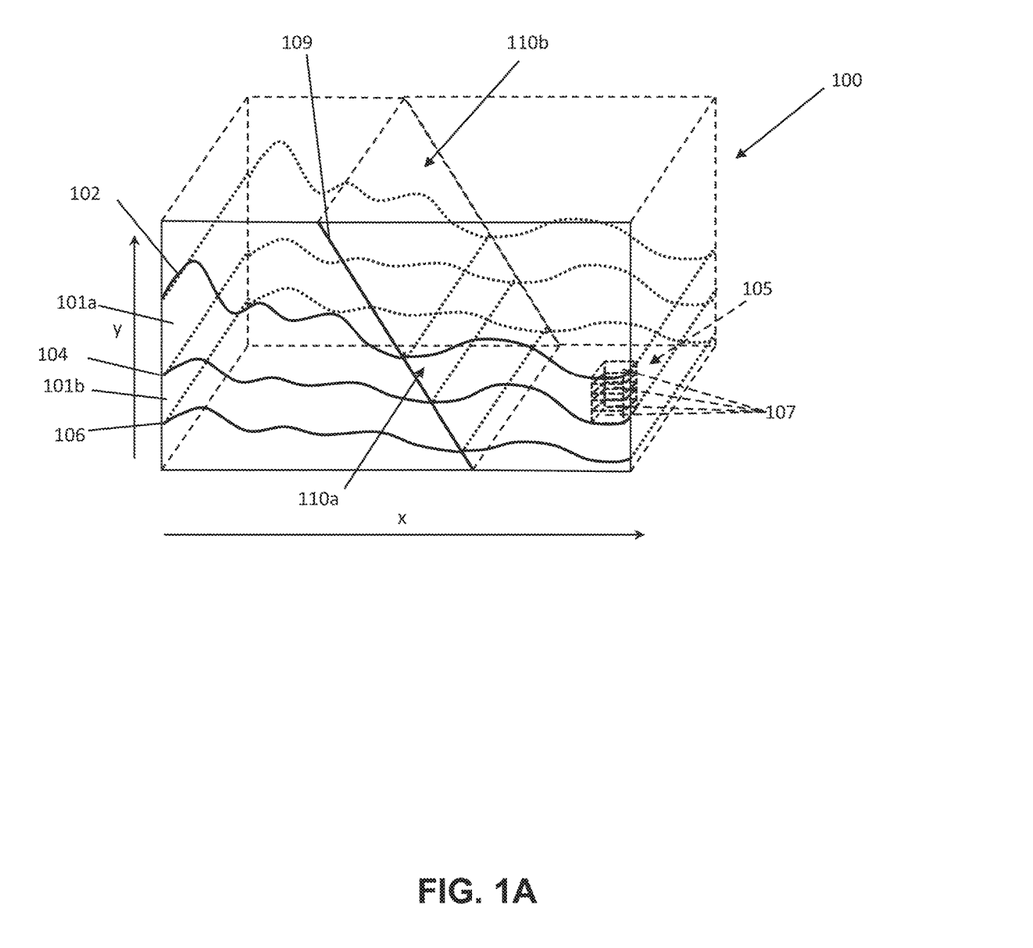
FIG. 1A illustrates an exemplary stratigraphic grid volume which may be used with embodiments of the disclosed methods.
Figure 1B:
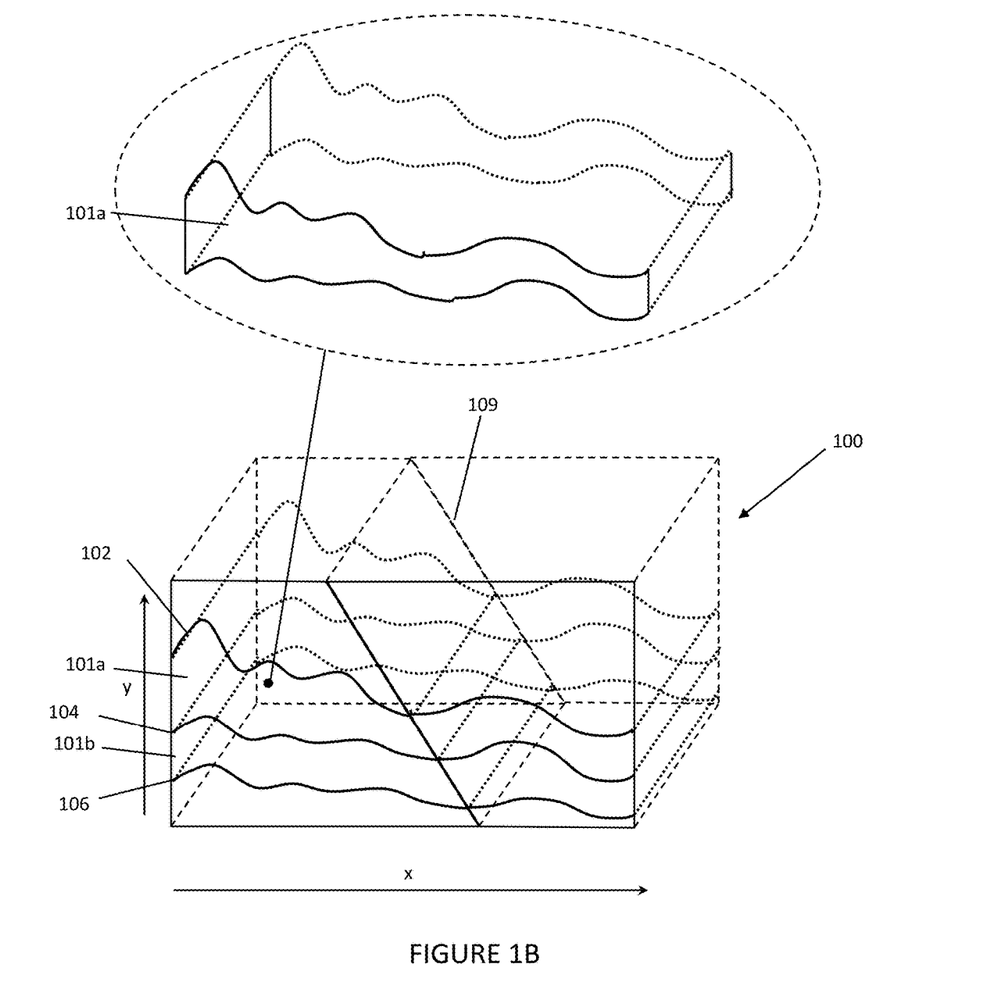
FIG. 1B illustrates an exemplary stratigraphic grid volume shown with a grid-sub-volume which may be used with embodiments of the disclosed methods.
Figure 1C:
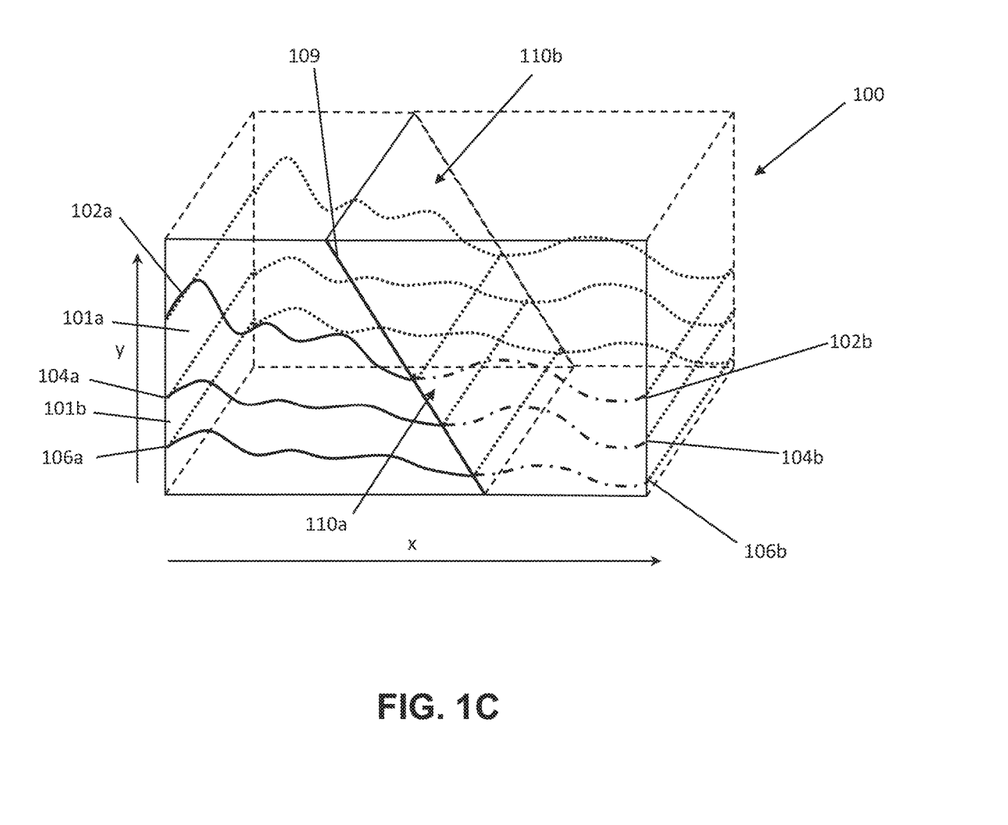
FIG. 1C illustrates the division of the reference surfaces in an embodiment of the disclosed methods.
Figure 1D:
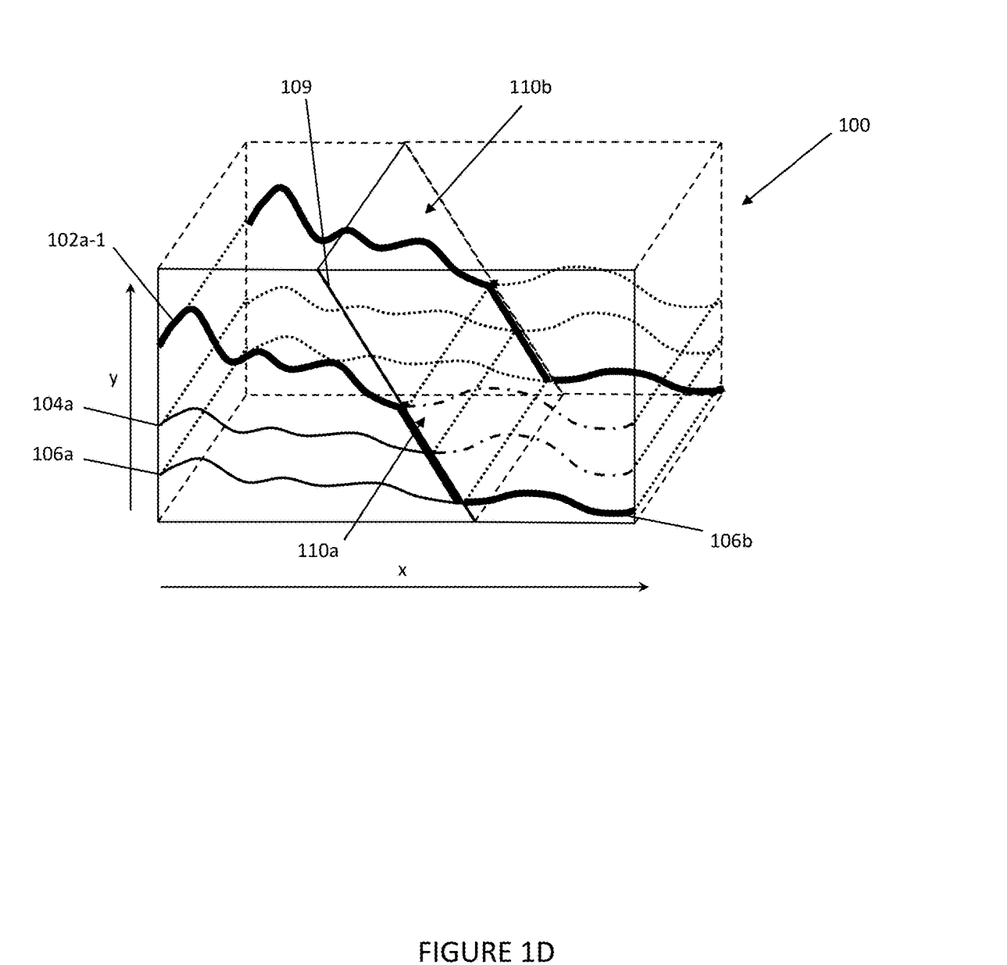
FIG. 1D illustrates the extension of the reference surfaces in an embodiment of the disclosed methods.
Figure 1E:
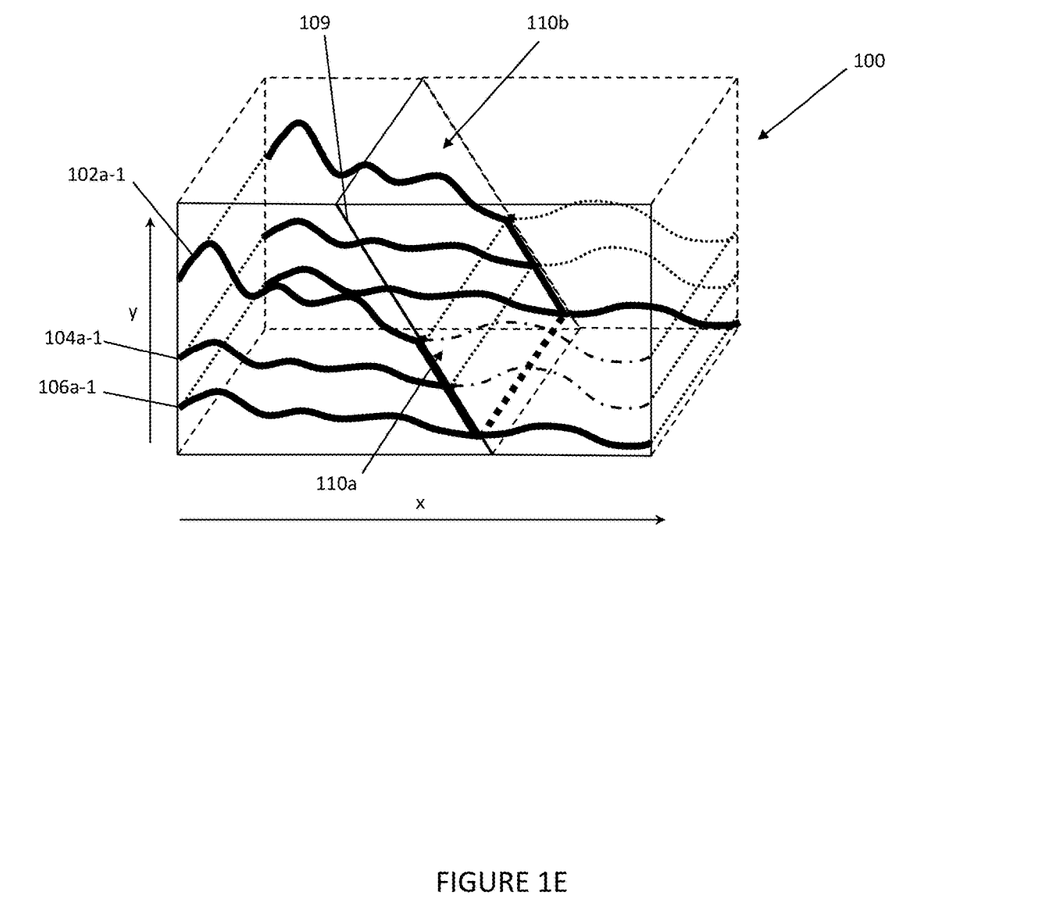
FIG. 1E illustrates the grouping of the reference surfaces in an embodiment of the disclosed methods.

One surface may be extended below the fault surface (e.g. foot wall side 110a of a normal fault) and the other above the fault surface (e.g. the hanging wall side 110b of a normal fault), as shown in FIG. 1D. In order to logically completely separate the grid, the fault surface is extended beyond each grid sub-volume 101a. In embodiments, the fault surface may be extended so as to terminate at the boundary of the stratigraphic grid volume 100.

In an embodiment, the fault surfaces constructed as described above may be used to partition each of the reference surfaces that intersect with the fault surface into separate parts or portions as shown in FIG. 1C. The surfaces that are below the fault surface form one set of the reference surfaces, which may be referred to as the foot wall surface set. In the example shown in FIG. 1C, they are labeled as 102a, 104a, and 106a. The parts that are above the fault surface form another set of the reference surfaces, which may be referred to as the hanging wall surface set, that are labeled as 102b, 104b, and 106b as shown in the example shown in FIG. 1C.

In an embodiment, the method includes extending the set of the reference surfaces that are below the fault surface along the bottom or footwall side 110a of that fault 109 and the lowest reference surface on the other side of the fault, as shown in FIG. 1D. In this example, surface is extended down the lower or left fault surface and extended across surface 106b. This new extended surface 102a-1 (depicted as the extra bold line in FIG. 1E) may be used as the new reference surface to model movement along the fault 109. This extension is repeated for all other surfaces (e.g. 104*a*-1 and 106*a*-1 in FIG. 1E) below the fault 109.

Figure 1F:
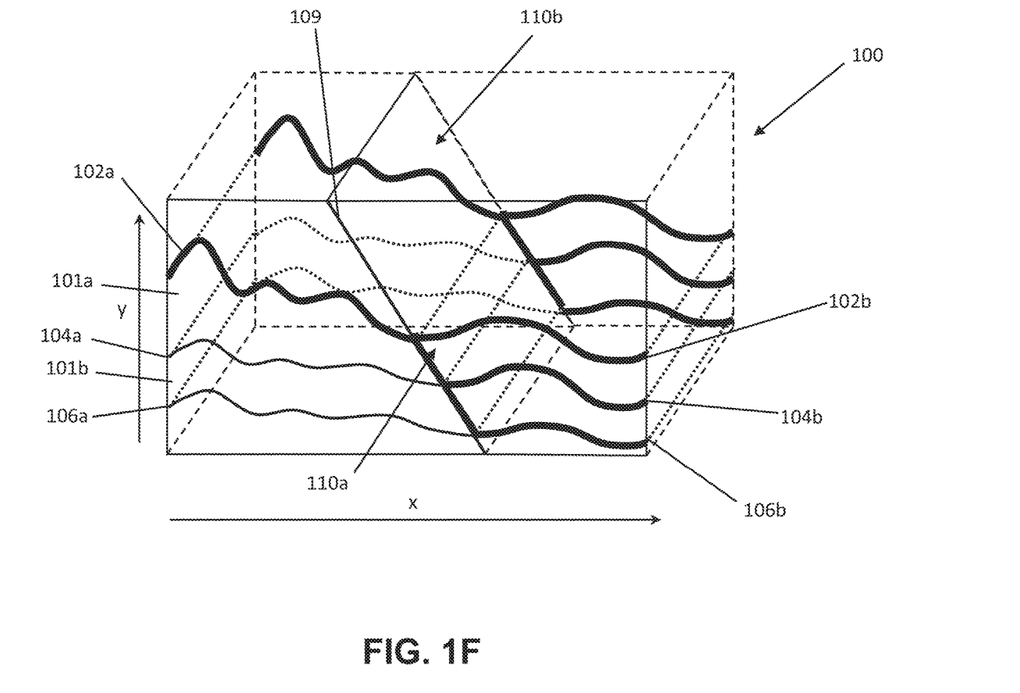
FIG. 1F illustrates the grouping of the reference surfaces in an embodiment of the disclosed methods.

Similarly, the reference surfaces that are above or the right of the fault 109 may be extended along the top or right side of the fault surface 110*a*, and further extended on top of the highest reference surface 102*a*, as shown in FIG. 1F. The grid is now configured for individual grid sub-volumes to move along the fault 109.

Figure 1G:
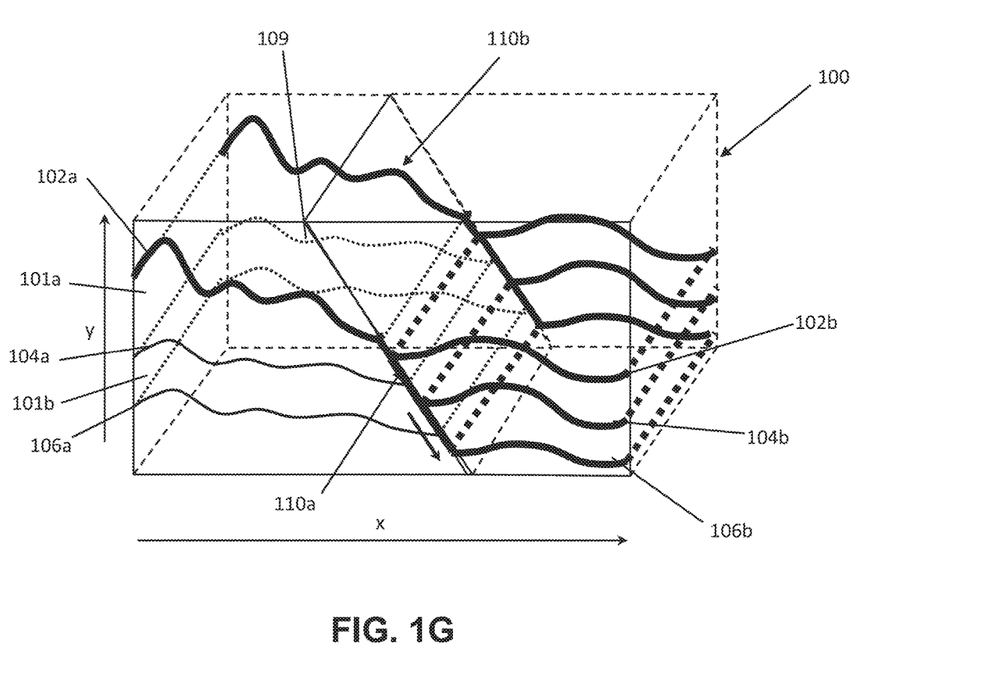
FIG. 1G illustrates the modeled movement of the hanging wall surface set in an embodiment of the disclosed methods.

As determined by user input parameters (e.g. displacement vector, displacement rate, direction of displacement, etc.) the movement of each grid sub-volume along the fault 109 may be modeled vertically and laterally as shown in FIG. 1G. The left or foot wall side reference surfaces (102*a*, 104*a*, and 106*a*) may be shifted "up" or "down" while the right or hanging wall surfaces (102*b*, 104*b*, and 106*b*) may be shifted "up" or "down," depending on user inputs. The distance shifted (i.e. displacement) and the direction shifted may be determined by user input or alternatively, may be modeled or simulated. In an embodiment, the extended fault surface may be treated as a rigid surface. A user may specify the lateral displacement of both the hanging wall side grid sub-volumes, and the foot wall side of the grid sub-volumes. After the simulated movement, the lowest reference surface (e.g. 106*b*) in the hanging wall side may be draped on top of the extended fault surface by changing the z coordinate on that reference surface using $z(x_g,y_g)=z(x_g,y_g)-dz(x_g,y_g)$. $dz(x_g,y_g)$ as the gap between the lowest reference surface and the extended fault surface. The same operation may be applied to all the reference surfaces in the hanging wall side. In the foot wall side, after the simulated or modeled movement, the highest reference surface (e.g. 102*a*) in the foot wall side may draped upwards to right beneath the extended fault surface by changing the z coordinate on the reference surface using $z(x_g,y_g)=z(x_g,y_g)+dz(x_g,y_g)$, where $dz(x_g,y_g)$ is the gap between the extended fault surface and the highest reference surface on the foot wall side. For illustrative purposes only, in FIG. 1G, the hanging wall side surfaces have been shifted "down" along the hanging side surface 110*b* of fault 109.

Figure 1H:
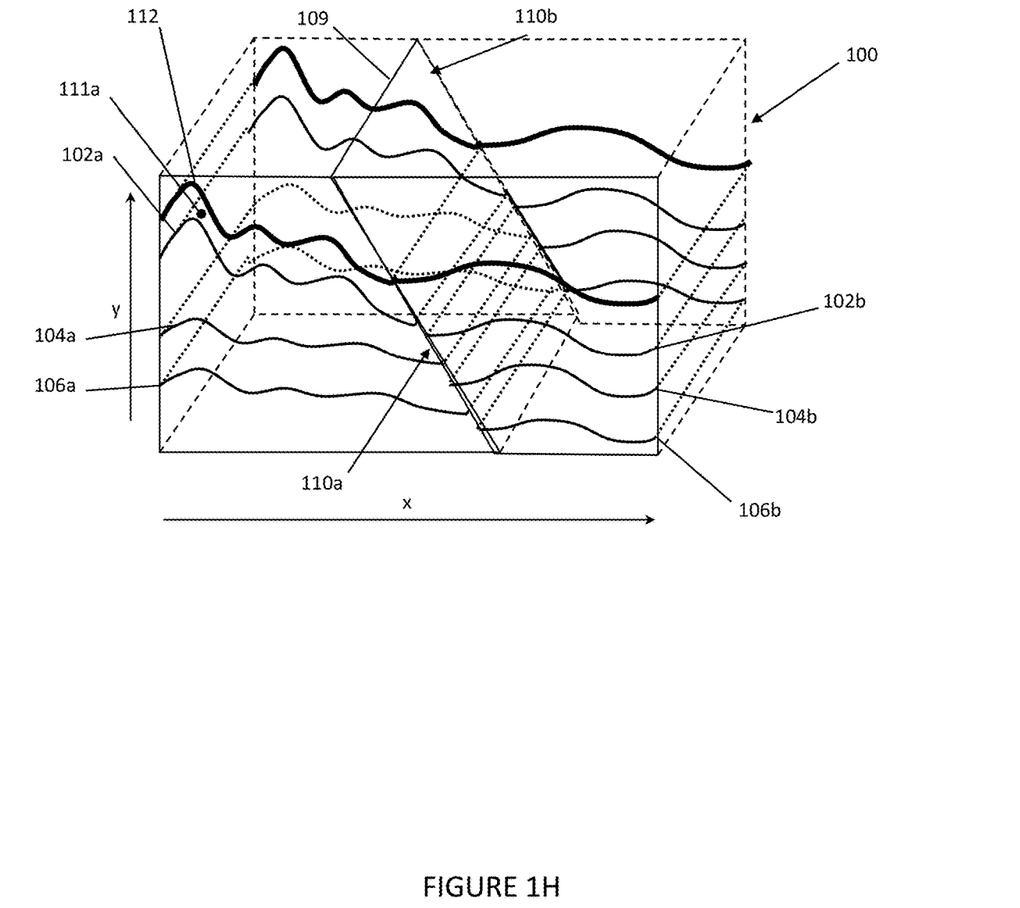
FIG. 1H illustrates the addition of another grid sub-volume to model deposition in an embodiment of the disclosed methods.
Figure 1I:
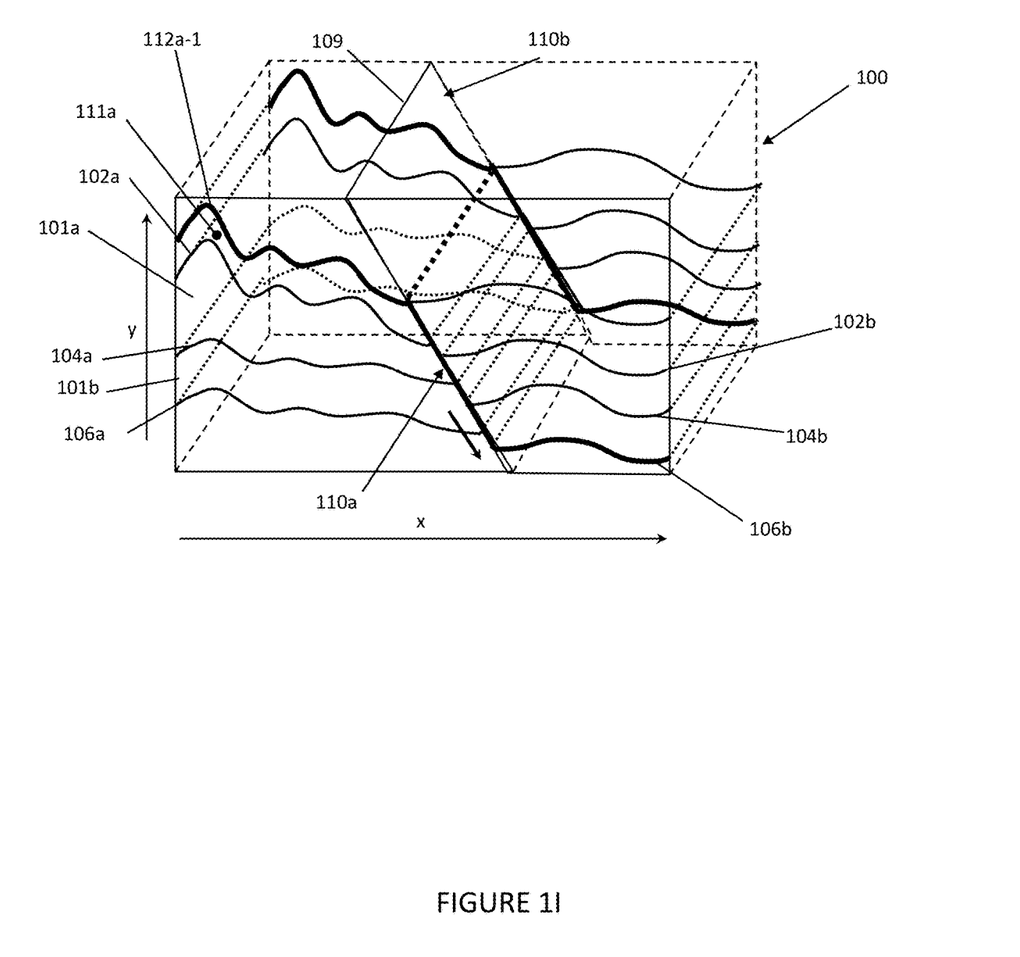
FIG. 1I illustrates the extension of the reference surface from the added grid sub-volume in an embodiment of the disclosed methods.
Figure 2:
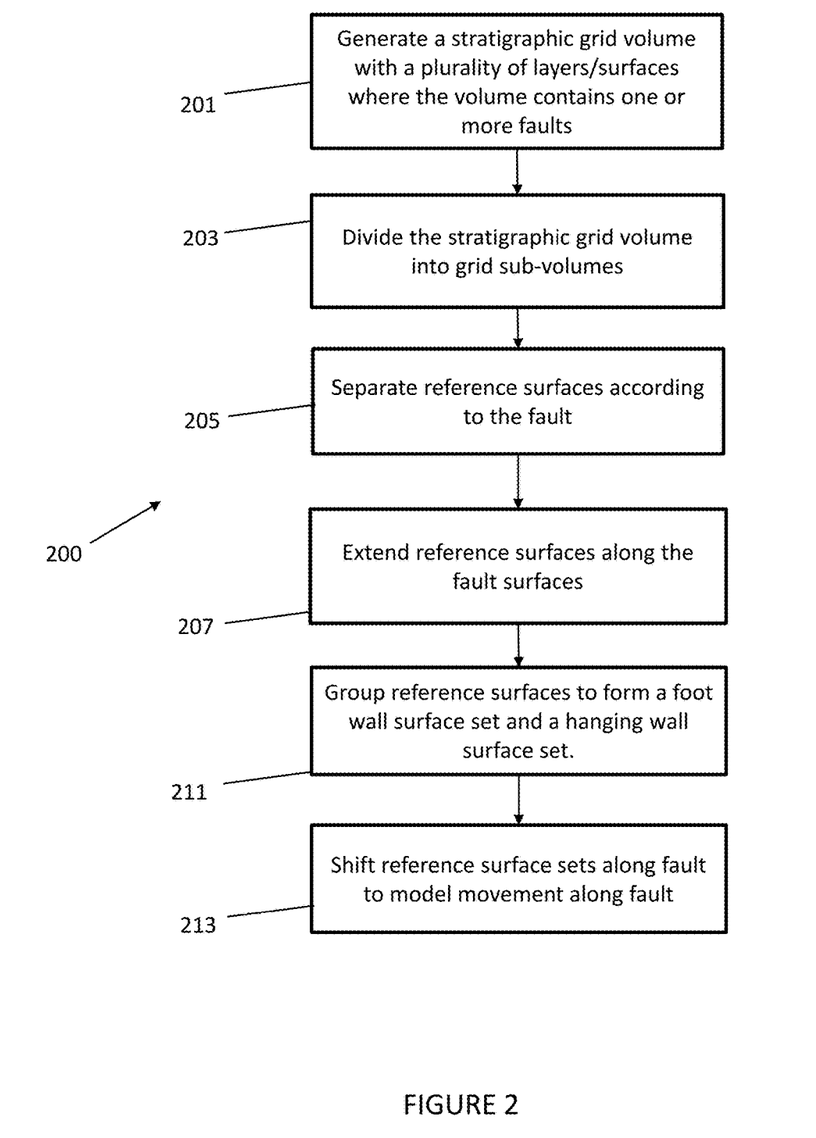
FIG. 2 illustrates a flowchart outlining an embodiment of the disclosed methods.

In an embodiment, an additional grid sub-volume 111*a* may be added to grid 100 to model additional deposition after modeling shifting due to the fault 109. To add a new grid sub-volume to the existing grid 100, the new grid volume 111*a* may be placed on top of an existing grid volume 101*a*, as shown in FIG. 1H. The reference surface 112 of the newly added grid sub-volume may be compared with the existing fault 109. The portion of the reference surface that is below the fault surface is separated from the rest part of the reference surface that is above the fault surface to form reference surface 112*a*-1, as shown in FIG. 1I. The grid sub-volume that is associated with the reference surface that is below the fault surface may be added to the left set of the reference surfaces, and the grid sub-volume that is associated with the reference surface that is above the fault surface is added to the right set of the reference surfaces. The newly deposited reference surfaces (e.g. 112*a*-1) may then be moved or shifted along fault with the other existing reference surfaces (e.g. 102*a*-1, 104*a*-1, etc). Additional deposition (i.e. additional sub-volumes) may be modeled by adding additional grid sub-volumes and repeating 205 through 213 in FIG. 2 as needed.

In an embodiment, some adjacent grid sub-volumes may be combined and the reference surfaces that were associated with those combined grid sub-volumes may be removed, to reduce the total number of reference surfaces, which may further improve the efficiency of the code.

Figure 4:
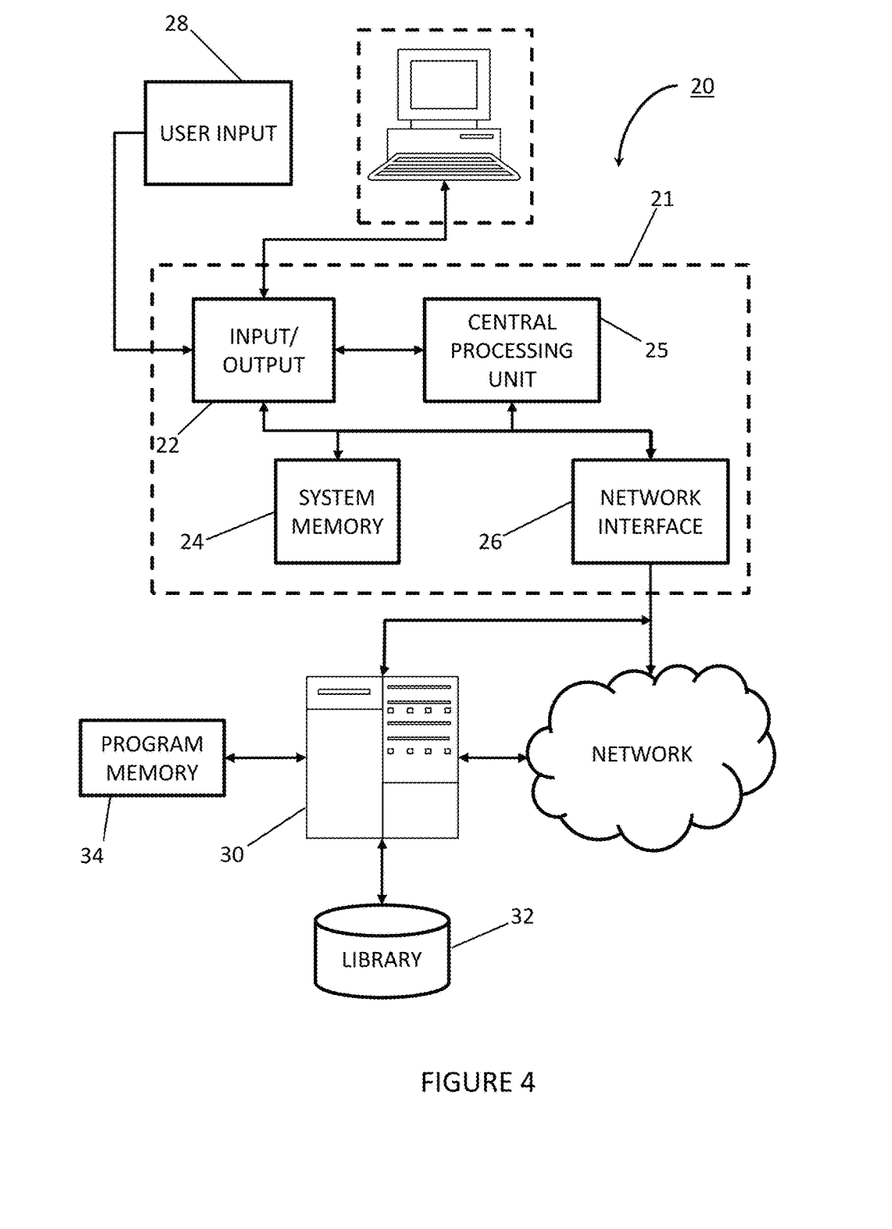
FIG. 4 illustrates a schematic of a system which may be used in conjunction with embodiments of the disclosed methods.

FIG. 4 illustrates, according to an example of an embodiment computer system 20, which may perform the operations described in this specification to perform the operations disclosed in this specification. In this example, system 20 is as realized by way of a computer system including workstation 21 connected to server 30 by way of a network. Of course, the particular architecture and construction of a computer system useful in connection with this invention can vary widely. For example, system 20 may be realized by a single physical computer, such as a conventional workstation or personal computer, or alternatively by a computer system implemented in a distributed manner over multiple physical computers. Accordingly, the generalized architecture illustrated in FIG. 4 is provided merely by way of example.

As shown in FIG. 4 and as mentioned above, system 20 may include workstation 21 and server 30. Workstation 21 includes central processing unit 25, coupled to system bus. Also coupled to system bus is input/output interface 22, which refers to those interface resources by way of which peripheral functions P (e.g., keyboard, mouse, display, etc.) interface with the other constituents of workstation 21. Central processing unit 25 refers to the data processing capability of workstation 21, and as such may be implemented by one or more CPU cores, co-processing circuitry, and the like. The particular construction and capability of central processing unit 25 is selected according to the application needs of workstation 21, such needs including, at a minimum, the carrying out of the functions described in this specification, and also including such other functions as may be executed by computer system. In the architecture of allocation system 20 according to this example, system memory 24 is coupled to system bus, and provides memory resources of the desired type useful as data memory for storing input data and the results of processing executed by central processing unit 25, as well as program memory for storing the computer instructions to be executed by central processing unit 25 in carrying out those functions. Of course, this memory arrangement is only an example, it being understood that system memory 24 may implement such data memory and program memory in separate physical memory resources, or distributed in whole or in part outside of workstation 21. In addition, as shown in FIG. 5, parameter inputs 28 may be input via input/output function 22, and stored in a memory resource accessible to workstation 21, either locally or via network interface 26.

Network interface 26 of workstation 21 is a conventional interface or adapter by way of which workstation 21 accesses network resources on a network. As shown in FIG. 7, the network resources to which workstation 21 has access via network interface 26 includes server 30, which resides on a local area network, or a wide-area network such as an intranet, a virtual private network, or over the Internet, and which is accessible to workstation 21 by way of one of those network arrangements and by corresponding wired or wireless (or both) communication facilities. In this embodiment of the invention, server 30 is a computer system, of a conventional architecture similar, in a general sense, to that of workstation 21, and as such includes one or more central processing units, system buses, and memory resources, network interface functions, and the like. According to this embodiment of the invention, server 30 is coupled to program memory 34, which is a computer-readable medium that stores executable computer program instructions, according to which the operations described in this specification are carried out by allocation system 30. In this embodiment of the invention, these computer program instructions are executed by server 30, for example in the form of a "web-based" application, upon input data communicated from workstation 21, to create output data and results that are communicated to workstation 21 for display or output by peripherals P in a form useful to the human user of workstation 21. In addition, library 32 is also available to server 30 (and perhaps workstation 21 over the local area or wide area network), and stores such archival or reference information as may be useful in allocation system 20. Library 32 may reside on another local area network, or alternatively be accessible via the Internet or some other wide area network. It is contemplated that library 32 may also be accessible to other associated computers in the overall network.

The particular memory resource or location at which the measurements, library 32, and program memory 34 physically reside can be implemented in various locations accessible to allocation system 20. For example, these data and program instructions may be stored in local memory resources within workstation 21, within server 30, or in network-accessible memory resources to these functions. In addition, each of these data and program memory resources can itself be distributed among multiple locations. It is contemplated that those skilled in the art will be readily able to implement the storage and retrieval of the applicable measurements, models, and other information useful in connection with this embodiment of the invention, in a suitable manner for each particular application.

According to this embodiment, by way of example, system memory 24 and program memory 34 store computer instructions executable by central processing unit 25 and server 30, respectively, to carry out the disclosed operations described in this specification, for example, by way of which the reference surfaces may be shifted or moved along the fault. These computer instructions may be in the form of one or more executable programs, or in the form of source code or higher-level code from which one or more executable programs are derived, assembled, interpreted or compiled. Any one of a number of computer languages or protocols may be used, depending on the manner in which the desired operations are to be carried out. For example, these computer instructions may be written in a conventional high level language, either as a conventional linear computer program or arranged for execution in an object-oriented manner. These instructions may also be embedded within a higher-level application. Such computer-executable instructions may include programs, routines, objects, components, data structures, and computer software technologies that can be used to perform particular tasks and process abstract data types. It will be appreciated that the scope and underlying principles of the disclosed methods are not limited to any particular computer software technology. For example, an executable web-based application can reside at program memory 34, accessible to server 30 and client computer systems such as workstation 21, receive inputs from the client system in the form of a spreadsheet, execute algorithms modules at a web server, and provide output to the client system in some convenient display or printed form. It is contemplated that those skilled in the art having reference to this description will be readily able to realize, without undue experimentation, this embodiment of the invention in a suitable manner for the desired installations. Alternatively, these computer-executable software instructions may be resident elsewhere on the local area network or wide area network, or downloadable from higher-level servers or locations, by way of encoded information on an electromagnetic carrier signal via some network interface or input/output device. The computer-executable software instructions may have originally been stored on a removable or other non-volatile computer-readable storage medium (e.g., a DVD disk, flash memory, or the like), or downloadable as encoded information on an electromagnetic carrier signal, in the form of a software package from which the computer-executable software instructions were installed by allocation system 20 in the conventional manner for software installation.

While the embodiments of the invention have been shown and described, modifications thereof can be made by one skilled in the art without departing from the spirit and teachings of the invention. The embodiments described and the examples provided herein are exemplary only, and are not intended to be limiting. Many variations and modifications of the invention disclosed herein are possible and are within the scope of the invention. Accordingly, the scope of protection is not limited by the description set out above, but is only limited by the claims which follow, that scope including all equivalents of the subject matter of the claims.

The discussion of a reference is not an admission that it is prior art to the present invention, especially any reference that may have a publication date after the priority date of this application. The disclosures of all patents, patent applications, and publications cited herein are hereby incorporated herein by reference in their entirety, to the extent that they provide exemplary, procedural, or other details supplementary to those set forth herein.

What is claimed is:

1. A computer-implemented method of stratigraphic modeling of syndepositional faults, the method comprising:
    (a) generating a stratigraphic grid volume at a past time representing a plurality of subterranean layers, the stratigraphic grid volume comprising a syndepositional fault;
    (b) dividing the stratigraphic grid volume into a plurality of grid sub-volumes, wherein each grid sub-volume is defined by a lower reference surface and an upper reference surface, wherein each grid sub-volume comprises a plurality of cells, wherein each cell is spatially defined relative only to the upper and the lower reference surfaces of the grid sub-volume and the upper and lower reference surfaces are defined according to a x,y,z coordinate system;
    (c) separating each of the upper and lower reference surfaces of each grid sub-volume into a foot wall section and a hanging wall section;
    (d) grouping the reference surfaces from the foot wall section together to form a foot wall surface set, and the reference surfaces from the hanging wall section together to form a hanging wall surface set;
    (e) extending each reference surface in both the foot wall surface set and the hanging wall surface set from each grid sub-volume to follow the syndepositional fault; and
    (f) shifting the foot wall surface set and the hanging wall surface set in the x,y,z coordinate system along the syndepositional fault to model movement forward in time along the syndepositional fault.

2. The method of claim 1 further comprising:
    (g) adding an additional stratigraphic grid sub-volume representing an additional subterranean layer to the stratigraphic grid volume and repeating (b) through (f) for the additional stratigraphic grid sub-volume to model the syndepositional fault.

3. The method of claim 1 wherein the syndepositional fault is curved.

4. The method of claim 1 wherein the syndepositional fault comprises more than one segment.

5. The method of claim 1 further comprising inputting one or more fault parameters which define the shifting the foot wall surface set and the hanging wall surface set along the syndepositional fault.

6. The method of claim 5 wherein the one or more fault parameters comprise a displacement vector, a displacement rate, a direction of displacement, or combinations thereof.

7. The method of claim 1 wherein the plurality of cells are structured or unstructured.

8. The method of claim 7 wherein the cells each comprises a polyhedral geometry.

9. The method of claim 1 wherein the cells are stacked vertically.

10. The method of claim 1, wherein the reference surfaces in the hanging wall surface set are above the syndepositional fault, and the reference surfaces in the foot wall surface set are below the hanging wall surface set and are extended along a bottom of the syndepositional fault.

11. A computer system, comprising:
an interface for receiving one or more user inputs;
a memory resource;
input and output functions for presenting and receiving communication signals to and from a human user;
one or more central processing units for executing program instructions; and program memory, coupled to the central processing unit, for storing a computer program including program instructions that, when executed by the one or more central processing units, cause the computer system to perform a plurality of operations for stratigraphic modeling of one or more syndepositional faults, the plurality of operations comprising:
(a) generating a stratigraphic grid volume at a past time representing a plurality of subterranean layers, the stratigraphic grid volume comprising a syndepositional fault;
(b) dividing the stratigraphic grid volume into grid sub-volumes, wherein each grid sub-volume is defined by a lower reference surface and an upper reference surface, wherein each grid sub-volume comprises a plurality of cells, wherein each cell is spatially defined relative only to the upper and lower reference surfaces of the grid sub-volume and the upper and lower reference surfaces are defined according to a x,y,z coordinate system;
(c) separating each of the upper and lower reference surfaces of each grid sub-volume into a foot wall section and a hanging wall section;
(d) grouping the reference surfaces from the foot wall section together to form a foot wall surface set, and the reference surfaces from the hanging wall section together to form a hanging wall surface set;
(e) extending each reference surface in both the foot wall surface set and the hanging wall surface set from each grid sub-volume to follow the syndepositional fault; and
(f) shifting the foot wall surface set and the hanging wall surface set in the x,y,z coordinate system along the syndepositional fault to model movement forward in time along the syndepositional fault.

12. The system of claim 11 further comprising:
(g) adding an additional stratigraphic grid sub-volume representing an additional subterranean layer to the stratigraphic grid volume and repeating (b) through (f) for the additional stratigraphic grid sub-volume.

13. The system of claim 11 wherein the syndepositional fault is curved.

14. The system of claim 11 wherein the syndepositional fault comprises more than one segment.

15. The system of claim 11 further comprising inputting one or more fault parameters which define the shifting the foot wall surface set and the hanging wall surface set along the syndepositional fault.

16. The system of claim 15 wherein the one or more fault parameters comprise a displacement vector, a displacement rate, a direction of displacement, or combinations thereof.

17. The system of claim 11 wherein the plurality of cells are structured or unstructured.

18. The system of claim 17 wherein the plurality of cells each comprises a polyhedral geometry.

19. The system of claim 11 wherein the plurality of cells are stacked vertically.

20. The system of claim 11, wherein the reference surfaces in the hanging wall surface set are above the syndepositional fault, and the reference surfaces in the foot wall surface set are below the hanging wall surface set and are extended along a bottom of the syndepositional fault.

21. A non-transitory, electronic storage medium having stored thereon processor readable instructions, wherein the instructions are configured to cause one or more processors to perform a method of stratigraphic modeling of syndepositional faults, the method comprising:
(a) generating a stratigraphic grid volume at a past time representing a plurality of subterranean layers, the stratigraphic grid volume comprising a syndepositional fault;
(b) dividing the stratigraphic grid volume into a plurality of grid sub-volumes, wherein each sub-volume is defined by a lower reference surface and an upper reference surface, wherein each grid sub-volume comprises a plurality of cells, wherein each cell is spatially defined relative only to the upper and the lower reference surfaces of the sub-volume and the upper and lower reference surfaces are defined according to a x,y,z coordinate system;
(c) separating each of the upper and lower reference surfaces of each grid sub-volume into a foot wall section and a hanging wall section;
(d) grouping the reference surfaces from the foot wall section together to form a foot wall surface set, and the references surfaces from the hanging wall section together to form a hanging wall surface set;
(e) extending each reference surface in both the foot wall surface set and the hanging wall surface set from each grid sub-volume to follow the syndepositional fault; and
(f) shifting the foot wall surface set and the hanging wall surface set in the x,y,z coordinate system along the syndepositional fault to model movement forward in time along the syndepositional fault.

22. The non-transitory, electronic storage medium of claim 21, wherein the reference surfaces in the hanging wall surface set are above the syndepositional fault, and the reference surfaces in the foot wall surface set are below the hanging wall surface set and are extended along a bottom of the syndepositional fault.

* * * * *